United States Patent
Shih et al.

(12)

(10) Patent No.: US 6,589,852 B1
(45) Date of Patent: Jul. 8, 2003

(54) METHOD OF REPLICATING ALIGNMENT MARKS FOR SEMICONDUCTOR WAFER PHOTOLITHOGRAPHY

(75) Inventors: Tsu Shih, Hsin-Chu (TW); Sung-Ming Jang, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 0 days.

(21) Appl. No.: 10/154,463

(22) Filed: May 23, 2002

(51) Int. Cl.[7] ............................................. H01L 21/76
(52) U.S. Cl. ...................................... 438/401; 438/584
(58) Field of Search ................................. 438/401, 462, 438/584; 257/797

(56) References Cited

U.S. PATENT DOCUMENTS 5,369,050 A * 11/1994 Kawai ........................ 438/401
5,911,108 A * 6/1999 Yen .......................... 438/401
6,020,249 A * 2/2000 Shih et al. .................. 438/401

* cited by examiner

*Primary Examiner*—T. N. Quach
(74) *Attorney, Agent, or Firm*—Tung & Associates

(57) ABSTRACT

A method for avoiding a step height over an alignment mark area including providing at least one alignment mark area disposed at a semiconductor wafer process surface periphery said alignment mark area having alignment marks anisotropically etched into the semiconductor wafer process surface; depositing a first insulating dielectric layer over an active area of the semiconductor wafer process surface to include covering the at least one alignment mark area; planarizing the first insulating dielectric layer; depositing a polysilicon layer over the active area of the semiconductor wafer process surface to include covering the at least one alignment mark area; and, anisotropically etching the polysilicon layer through a thickness over the at least one alignment mark area to form an opening extending no further than about the first insulating dielectric layer to minimize a step height.

20 Claims, 2 Drawing Sheets

METHOD OF REPLICATING ALIGNMENT MARKS FOR SEMICONDUCTOR WAFER PHOTOLITHOGRAPHY

FIELD OF THE INVENTION

This invention generally relates to semiconductor processing methods including photolithographic patterning and more particularly to a method for replicating alignment marks for semiconductor wafer photolithography.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is a preferred electrical isolation technique especially for a semiconductor chip with high integration. STI features can be made using a variety of methods including, for example, the Buried Oxide (BOX) isolation method for shallow trenches. The BOX method involves filling the trenches with a chemical vapor deposition (CVD) silicon oxide ($SiO_2$), also referred to as an STI oxide which is then etched back or chemically mechanically polished (CMP) to remove the overlying layer of STI oxide to yield a planar surface. The shallow trenches etched for the BOX process are anisotropically plasma etched into the substrate, for example, silicon, and are typically between 0.3 and 1.0 microns deep.

Shallow trench isolation features with trenches having submicrometer dimensions are effective in preventing latch-up and punch-through phenomena. Broadly speaking, conventional methods of producing a shallow trench isolation feature include: forming a hard mask, for example silicon nitride, over the targeted trench layer, for example including a pad oxide layer, patterning a photoresist over the hard mask to define a trench feature, anisotropically etching the hard mask to form a patterned hard mask, and thereafter anisotropically etching the trench feature to form the shallow trench isolation feature. Subsequently, the photoresist is removed (e.g., stripped) and the shallow trench isolation feature is back-filled, with a dielectric material, for example a CVD silicon oxide, also referred to as an STI oxide.

In forming the various levels of a multilevel semiconductor device including shallow trench isolation features, semiconductor wafer alignment for positioning the semiconductor wafer for subsequent device feature patterning is critical. In a typical photolithographic patterning procedure, an automated stepper, for example, an ASM Lithography photo system sequentially positions the wafer beneath a photo imaging system for transferring a patterned photo image (mask) of device features to expose a photoresist material overlying the semiconductor wafer surface. As positioning of the process wafer is critical for forming operational semiconductor features, methods for forming alignment marks in the semiconductor wafer surface have evolved to allow the automated stepper to optically sense the alignment marks for proper process wafer positioning.

Several wafer alignment strategies exist for using different patterns and locations to achieve the alignment of a semiconductor wafer to a mask containing an image to be transferred to the wafer. These strategies vary from alignment marks located between shot sites (also known as chip sites) to global alignment marks located in two shot sites at the periphery of the wafer. There are also global strategies in which the alignment marks are located between shot sites in the more peripheral regions of the wafer.

In one approach for global alignment, at least two areas at the wafer periphery are selected, typically located on opposite sides of the wafer diameter and include a series of parallel scribe marks covering area of about 400 microns× 400 microns referred to as zero-level alignment marks that are etched into the silicon before other processing steps. The global alignment marks are subsequently replicated in each subsequent level of manufacturing the multi-level semiconductor device.

In processes according to the prior art, for example, associated with trench isolation manufacture, a first layer of insulating dielectric layer, often referred to as an STI oxide, for example, silicon oxide, is formed to backfill trenched areas formed in a silicon substrate to form shallow trench isolation features around areas of the device. During the various material depositions and planarization steps the wafer peripheral areas including areas containing alignment marks (alignment mark areas) reflect various global material deposition and planarization steps that are carried out to form semiconductor devices in the active areas of the process wafer. As a result of active area processing steps the alignment mark areas include a layer of the STI oxide.

To preserve replication of the alignment marks for use in subsequent photolithographic patterning steps, in one approach, an anisotropic etching process is carried out on the STI oxide to form a window area to surround the alignment mark areas and to expose the underlying alignment marks with the window area having a depth greater than a subsequent STI oxide CMP polishing depth. A CMP step is subsequently carried out to planarize the STI oxide having a CMP polishing depth less than the previously formed window areas thereby preserving the alignment marks. Following the STI oxide CMP step a layer of polysilicon is conformally deposited thereby replicating the alignment marks. Following deposition and patterning steps performed on the polysilicon layer an insulating dielectric layer also often referred to as an interlayer dielectric (ILD) is conformally deposited and planarized according to a CMP process. Subsequently a metal layer, for example copper, is deposited and subsequently planarized according to a CMP process.

One problem according to prior art methods of replicating alignment marks, is that the window areas formed to surround the alignment marks necessarily having a step height or depth sufficient to survive a subsequent STI oxide CMP step, causes a recessed area to remain in the ILD layer overlying the alignment mark area following deposition and planarization of the ILD layer. The formation of the recessed area is due to the conformal nature of subsequently deposited layers and the step height of the window area formed over the alignment mark area. As a result, in depositing and planarizing the subsequent metal layer, the recessed areas including over the alignment mark area in the ILD layer tend to accumulate residual metal, for example copper, following a CMP step. In subsequent processing steps, for example to form metal interconnects such as damascene features in overlying insulating dielectric layers, the alignment process for photolithographically patterning such structures is likely to fail as the metallic residue interferes with overlying oxide. As a result photolithographic patterning steps are compromised.

Therefore, there is a need in the semiconductor processing art to develop an improved method for replicating alignment marks such that residual metal forming over alignment marks is avoided.

It is therefore an object of the invention to provide an improved method for replicating alignment marks such that residual metal forming over alignment marks is avoided while overcoming other shortcomings of the prior art.

SUMMARY OF THE INVENTION

To achieve the foregoing and other objects, and in accordance with the purposes of the present invention, as embodied and broadly described herein, the present invention provides a method for avoiding a step height over an alignment mark area.

In a first embodiment the method includes providing at least one alignment mark area disposed at a semiconductor wafer process surface periphery said alignment mark area having alignment marks anisotropically etched into the semiconductor wafer process surface; depositing a first insulating dielectric layer over an active area of the semiconductor wafer process surface to include covering the at least one alignment mark area; planarizing the first insulating dielectric layer; depositing a polysilicon layer over the active area of the semiconductor wafer process surface to include covering the at least one alignment mark area; and, anisotropically etching the polysilicon layer through a thickness over the at least one alignment mark area to form an opening extending no further than about the first insulating dielectric layer to minimize a step height.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1:
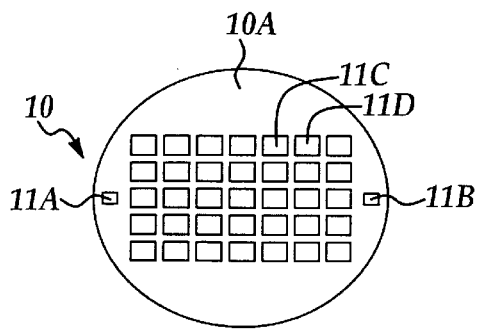
FIG. 1 is a top view of an exemplary semiconductor wafer showing conceptually representative active areas and alignment mark areas.

The method of the present invention is explained with respect to the parallel effect of various processing steps of an active area of a semiconductor process wafer on alignment mark areas disposed at the peripheral portions of the semiconductor wafer. For example, the method of the present invention is explained with reference to the processing effects of active areas on alignment mark areas in connection with the formation of shallow trench isolation features and subsequent processing steps commonly used for forming CMOS semiconductor features. For simplicity and clarity, the focus of the explaining the method of the present invention is on the effect of such processing steps on the alignment mark areas where the method of the present invention directed to avoiding detrimental effects of such processing steps, such as recessed areas overlying alignment mark areas, on subsequent replication of the alignment marks. The term 'active areas' as used herein refers to areas of the semiconductor process surface where electrically active areas are formed for operating a completed semiconductor device. The term 'copper' as used herein includes copper or alloys thereof. The term 'anisotropic etching' refers to a reactive ion etching (RIE) otherwise known as plasma etching.

In a first embodiment of the present invention, a first insulating dielectric layer is deposited to cover a substrate forming a semiconductor process surface, including at least one alignment mark area having anisotropically etched alignment marks etched into the process surface and disposed at the process surface periphery.

For example, the first insulating dielectric layer is an STI oxide layer deposited top fill STI trench features formed to surround active areas which process includes conformally covering the alignment marks formed in alignment mark areas disposed at the periphery of the semiconductor process surface. For example, the first insulating dielectric layer includes a CVD silicon oxide, for example silicon dioxide ($SiO_2$) formed of, for example, tetra ethyl orthosilane (TEOS), deposited at a thickness of from about 3000 to about 10000 Angstroms. For example, the alignment mark areas include alignment marks, for example, parallel lines etched into the process surface of a semiconductor wafer substrate, for example silicon. For example, the alignment mark areas include at least two areas each of which is about 400 microns by about 400 microns. The alignment mark areas, for example, are disposed along opposing peripheral portions of the semiconductor wafer process surface. As is known in the art, the alignment marks are formed in a manner to provide contrasting patterns for auto-sensing and positioning the semiconductor wafer by a photolithographic imaging system using an automated sequential stepper, for example, an ASM Lithography photo-exposure system.

Following deposition of the first insulating dielectric layer, in the method according to the present invention, the first insulating dielectric layer is planarized, preferably according to a conventional CMP process, to provide a planarized surface thereby eliminating a step height due to conformal deposition of the first insulating dielectric layer overlying the alignment mark areas. In contrast with the prior art processes, the STI oxide layer is not anisotropically etched to expose the alignment marks and form a recessed window area. Thereafter, a polysilicon layer is deposited over active areas of the process surface and over the first insulating dielectric layer formed over the alignment mark areas. In the method according to the present invention, the polysilicon layer is photolithographically patterned and anisotropically etched according to a conventional polysilicon etching chemistry to provide polysilicon windows formed overlying the alignment mark areas and exposing the planarized surface of the underlying first insulating dielectric layer. Preferably, the polysilicon window surrounds the alignment mark area to allow a subsequent anisotropic etching process to expose the alignment marks without etching through a thickness of the polysilicon layer. The polysilicon layer is preferably formed having a thickness such of from about 1000 to about 4000 Angstroms.

In another embodiment, the polysilicon layer is photolithographically patterned and anisotropically etched to provide a polysilicon window overlying the alignment mark area having newly formed alignment marks etched into the polysilicon in a bottom portion of the polysilicon window. For example, the newly formed alignment marks are preferably formed in parallel with patterning and etching of the polysilicon layer in the active areas of the process wafer.

Following photolithographically patterning and etching of the polysilicon layer, a second insulating dielectric layer, for example, a silicon oxide ($SiO_2$) or a low dielectric constant (<3.0) insulating dielectric such as fluorine or carbon doped silicon oxide is deposited by a conventional CVD process, for example PECVD or HDP-CVD, preferably having a thickness of from about 3000 Angstroms to about 10,000 Angstroms. The second insulating dielectric layer is then planarized, preferably by a conventional CMP process. As a result of the method of the present invention, whereby the first insulating dielectric layer remains planarized, a conformal step height is reduced in the deposited second insulating dielectric layer (e.g., ILD layer) overlying the alignment mark area. Subsequently, a conventional CMP process is preferably used to planarize the ILD surface providing a fully planarized ILD surface over the alignment mark areas.

Following planarization of the second insulating dielectric layer (e.g., ILD layer), a metal layer, for example copper, is formed over the second insulating dielectric layer, for example, by an electroplating or CVD process but excluding the periphery of the substrate surface including the alignment mark areas. Following deposition of the metal layer, for example copper, the metal layer is planarized preferably according to a conventional metal CMP process. As a result of the fully planarized ILD surface overlying the alignment mark areas, copper residue generated from the metal layer CMP process does not collect in recessed areas remaining over the alignment mark areas in contrast with prior art processes.

For example, referring to FIG. 1, in the method according to the present invention a substrate 10, for example a silicon semiconductor wafer 10 having a process surface 10A is provided. In an exemplary embodiment of the present invention the process surface 10A includes alignment mark areas e.g., 11A and 11B disposed in a peripheral portion of the process surface 10A and having active die area e.g., 11C, 11D disposed in a central portion of the process surface 10A for forming active semiconductor devices. In an exemplary embodiment of the present invention, a plurality of isolation features, including for example, shallow trench isolation (STI) features are formed to surround active areas included in the die areas (not shown). The STI features include backfilling anisotropically etched trench features with a CVD oxide, for example a silicon oxide ($SiO_2$) formed using TEOS as is known in the art.

Figure 2A:
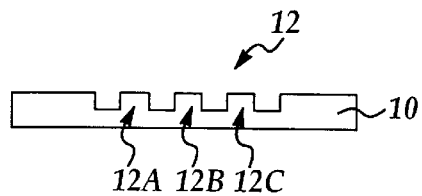
FIGS. 2A–2F are cross sectional side views of an exemplary alignment mark area at different stages of semiconductor device manufacture according to the present invention.

Referring to FIG. 2A is shown a portion of an exemplary alignment mark area 12 including features anisotropically etched into the silicon wafer 10 forming alignment marks e.g., 12A, 12B, 12C. For example, the alignment marks are formed as lines parallel with one another and equally spaced apart from one another. It will be appreciated that there may be several different types of alignment mark patterns depending on manufacturer requirements of the auto stepping imaging system.

Figure 2B:
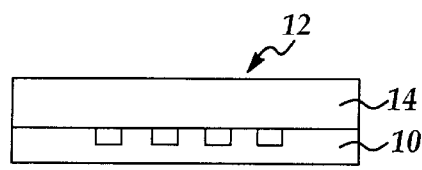

Referring to FIG. 2B, a first insulating dielectric layer 14, for example an STI oxide ($SiO_2$), is formed to cover the alignment mark area 12 including alignment marks e.g., 12A, 12B, 12C followed by a planarization process, for example, a CMP process to planarize the STI oxide thereby forming a planar surface overlying the alignment mark area 12. This feature of the invention can be contrasted with prior art processes of anisotropically etching the first insulating dielectric layer (STI oxide) to form a window area in the STI oxide over the alignment marks to create a window depth such that the alignment marks survive a subsequent STI oxide planarization.

Figure 2C:
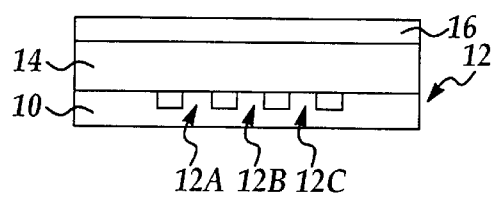
Figure 2D:
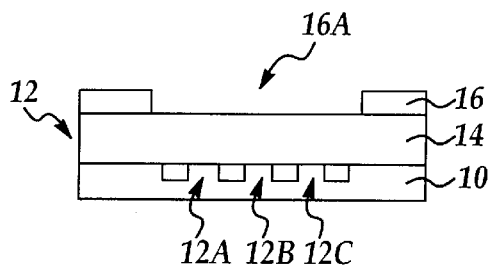

Referring to FIG. 2C, a polysilicon layer 16 is next deposited by conventional means, for example CVD, to include forming polysilicon layer 16 overlying the first insulating dielectric layer 14. Referring to FIG. 2D according to one embodiment of the present invention, the polysilicon layer 16 is patterned and anisotropically etched to include forming a polysilicon window area 16A overlying the alignment mark area 12 to expose the planarized surface of the first insulating dielectric layer 14 (e.g., STI oxide).

Figure 2E:
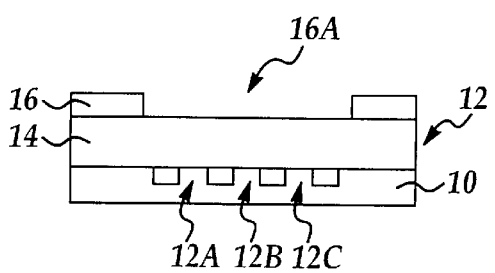

Referring to FIG. 2E, according to another embodiment, the polysilicon layer 16 is patterned and anisotropically etched to include forming a polysilicon window area 16A overlying the alignment mark areas.

Figure 2F:
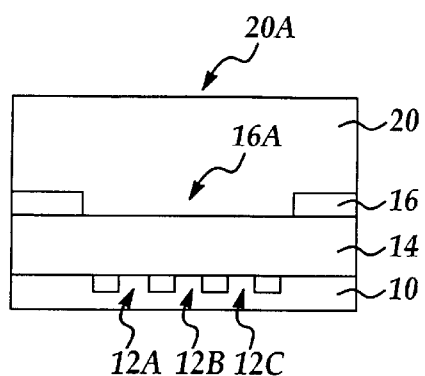

Referring to FIG. 2F, a second insulating dielectric layer 20, for example a low dielectric constant (e.g., <3.0) carbon doped silicon oxide layer is deposited by a conventional CVD method over active areas of the process wafer to include the polysilicon window area 16A overlying the alignment mark area 12 (as shown for the embodiment in FIG. 2D). The second insulting dielectric layer 20, for example, is often referred to an inter-level dielectric (ILD) layer. The ILD layer is conformally deposited over the substrate surface to include the polysilicon window area 16A followed by a conventional CMP process to planarize the ILD layer 20. According to the present invention, preferably the ILD planarization process is carried out to produce a fully planar upper surface 20A. Advantageously, according to the present invention any recessed topology in the ILD surface 20A sufficient for collecting residual metal particles following deposition and planarization of a metal layer is avoided.

Following planarization of the ILD layer 20, a metal layer, for example copper, is deposited over the active areas but excluding the alignment mark areas (i.e., not shown over alignment mark area) disposed at the process surface periphery. The metal layer, for example copper, is deposited by a conventional electrodeposition process. The electrodeposition process typically includes first depositing a seed layer of copper, for example, by physical vapor deposition PVD over the active areas of the wafer process surface followed by an electrodeposition process where an electric potential is applied to the seed layer to induce electrolytic plating of copper. Alternatively, the metal layer may be deposited by known CVD methods such as low pressure CVD (LPCVD). Following deposition of the metal layer over the active areas of the wafer process surface but excluding the alignment mark areas, the metal layer is planarized, preferably by a conventional CMP process.

In the method according to the present invention, accumulation of residual metal, for example copper, in recessed areas (non-planar) remaining in the ILD layer, for example overlying the alignment mark area 12 and polysilicon window 16A is avoided according to the present invention following the metal layer CMP process. As a result, residual copper overlying the alignment mark area is avoided and the failure rate of subsequent photolithographic patterning of metal interconnect such as damascene features in overlying insulating dielectric layers (not shown) is reduced.

Figure 3:
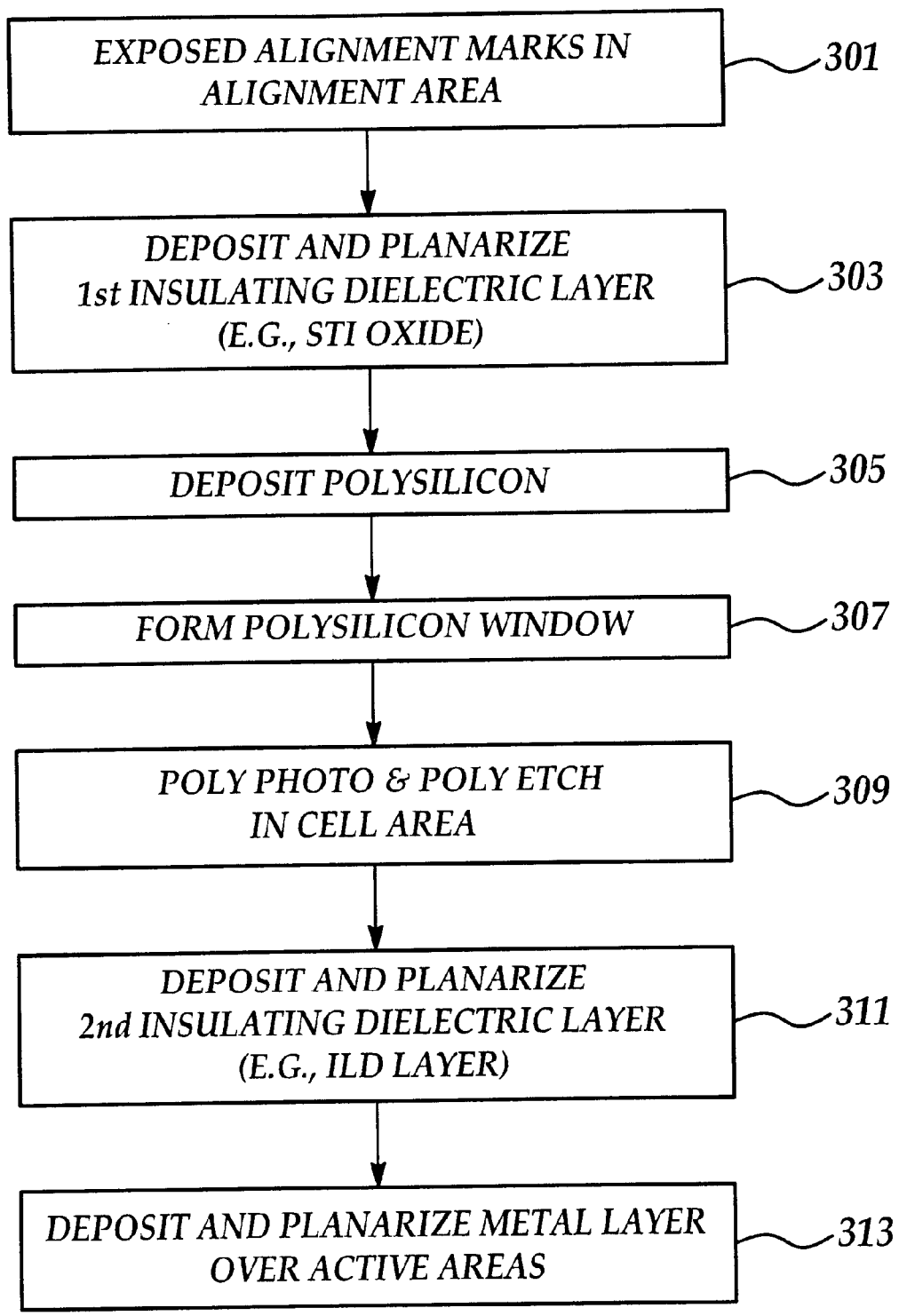
FIG. 3 is a process flow diagram including several embodiments of the present invention.

Referring to FIG. 3 is a process flow diagram including several embodiments of the present invention. In a first step

301, a wafer process surface having exposed alignment marks in at least one alignment mark area is provided. In process 303, a first insulating dielectric layer, for example, and STI oxide is deposited to include covering the alignment mark areas and then planarized, for example by a CMP process. In process 305, a polysilicon layer is deposited to include covering the planarized STI oxide in the alignment mark area. In one embodiment, in process 307, the polysilicon layer is patterned and anisotropically etched to form a polysilicon window overlying the alignment mark area exposing the planarized STI oxide surface. In an alternative embodiment, in process 309, the polysilicon layer is patterned and anisotropically etched to form a polysilicon window overlying the alignment mark area to include a second set of alignment marks formed in a bottom portion thereof. In process 311, a second insulating dielectric layer (e.g., an ILD layer) is deposited and planarized to form a planarized surface over the alignment mark area. In process 313, a metal layer is deposited over the active areas of the process wafer excluding that portion of the ILD layer overlying the alignment mark areas followed by metal layer planarization, preferably CMP.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for avoiding a step height over an alignment mark area comprising the steps of:
   providing at least one alignment mark area disposed at a semiconductor wafer process surface periphery said alignment mark area having alignment marks anisotropically etched into the semiconductor wafer process surface;
   depositing a first insulating dielectric layer over an active area of the semiconductor wafer process surface to include covering the at least one alignment mark area;
   planarizing the first insulating dielectric layer;
   depositing a polysilicon layer over the active area of the semiconductor wafer process surface to include covering the at least one alignment mark area; and,
   anisotropically etching the polysilicon layer through a thickness over the at least one alignment mark area to form an opening extending no further than about the first insulating dielectric layer to minimize a step height.

2. The method of claim 1, wherein the step of anisotropically etching the polysilicon layer includes revealing the first insulating dielectric layer.

3. The method of claim 1, wherein the step of anisotropically etching the polysilicon layer includes replicating the alignment marks in a bottom portion of the opening.

4. The method of claim 1, further including sequentially depositing and planarizing at least a second insulating dielectric layer including the at least one alignment mark area to provide fully planar second insulating dielectric layer surface overlying the at least one alignment mark area.

5. The method of claim 4, further including sequentially depositing and planarizing at least one metal layer over the active area of the semiconductor wafer process surface to produce a substantially metal free second insulating dielectric layer surface.

6. The method of claim 5, further including anisotropically etching through at least a thickness of the second dielectric insulating layer to reveal the alignment marks.

7. The method of claim 6, further including the step of forming a third insulating dielectric layer over the second insulating dielectric layer for forming damascene features therein.

8. The method of claim 5, wherein the metal layer includes copper or alloys thereof.

9. The method of claim 1, wherein the first insulating dielectric layer is a silicon oxide for backfilling shallow trench isolation features.

10. The method of claim 1, wherein the second insulating dielectric layer is an inter-level dielectric layer for forming damascene features therein.

11. The method of claim 10, wherein the inter-level dielectric layer is formed by CVD oxide.

12. A method for avoiding a step height over an alignment mark area to prevent metal residue accumulation following a metal CMP process comprising the steps of:
    providing semiconductor wafer having a process surface including a central portion and a peripheral portion said central portion including active areas and said peripheral portion including at least one alignment mark area said at least one alignment mark area having alignment marks anisotropically etched into the process surface;
    sequentially depositing and planarizing a first insulating dielectric layer over the semiconductor wafer process surface;
    depositing a polysilicon layer over the semiconductor wafer process surface;
    anisotropically etching the polysilicon layer through a thickness over the at least one alignment mark area to encompass the alignment mark area said opening extending no further than about the first insulating dielectric layer;
    sequentially depositing and planarizing at least a second insulating dielectric layer over the semiconductor wafer process surface to include forming a substantially planar upper surface of the second insulating dielectric layer overlying the alignment mark area; and,
    sequentially depositing and planarizing at least one metal layer over the active area of the semiconductor wafer process surface to leave a metal free surface overlying the at least one alignment mark area.

13. The method of claim 12, wherein the step of anisotropically etching the polysilicon layer includes revealing the first insulating dielectric layer.

14. The method of claim 12, wherein the step of anisotropically etching the polysilicon layer includes replicating the alignment marks in a bottom portion of the opening.

15. The method of claim 12, further including anisotropically etching through at least a thickness of the second dielectric insulating layer to reveal the alignment marks.

16. The method of claim 12, wherein the first insulating dielectric layer is a silicon oxide for backfilling shallow trench isolation features.

17. The method of claim 12, wherein the at least a second insulating dielectric layer includes an inter-level dielectric layer for forming damascene features therein.

18. The method of claim 17, wherein the inter-level dielectric layer includes CVD oxide.

19. The method of claim 12, further including the step of forming a third insulating dielectric layer over the second insulating dielectric layer for forming damascene features therein.

20. The method of claim 12, wherein the step of sequentially depositing and planarizing at least one metal layer includes depositing a layer of copper or alloys thereof according to an electrodeposition process.

* * * * *